United States Patent [19]

Chang et al.

[11] Patent Number: 4,608,706
[45] Date of Patent: Aug. 26, 1986

[54] HIGH-SPEED PROGRAMMABLE TIMING GENERATOR

[75] Inventors: Yihua E. Chang, Poughkeepsie; Lawrence J. Grasso, Pleasant Valley; Algirdas J. Gruodis; Carroll E. Morgan, both of Wappingers Falls, all of N.Y.

[73] Assignee: International Business Machines Corporation, Armonk, N.Y.

[21] Appl. No.: 512,856

[22] Filed: Jul. 11, 1983

[51] Int. Cl.$^4$ .......................................... H03K 27/00
[52] U.S. Cl. ...................................... 377/39; 377/129; 377/114
[58] Field of Search ............... 307/510, 518, 520, 269; 340/146.2; 377/39, 114, 129, 107, 110; 328/55, 63, 72, 155

[56] References Cited

U.S. PATENT DOCUMENTS

| | | | |
|---|---|---|---|
| 3,215,985 | 11/1965 | Marsh, Jr. .......................... | 340/146.2 |
| 3,258,696 | 6/1966 | Heymann .............................. | 377/75 |
| 3,510,633 | 5/1970 | Kintner ................................ | 377/39 |
| 3,539,926 | 11/1970 | Breikss ................................ | 377/114 |
| 3,579,281 | 5/1971 | Kam et al. ........................... | 331/10 |
| 3,588,707 | 6/1971 | Manship .............................. | 328/55 |
| 3,753,141 | 8/1973 | Elk et al. ............................. | 331/10 |
| 3,812,669 | 5/1974 | Wiget .................................. | 377/107 |
| 3,906,346 | 9/1975 | Hunter ................................ | 377/39 |
| 4,001,699 | 1/1977 | Denny et al. ........................ | 377/39 |
| 4,013,969 | 3/1977 | Dennison ............................ | 328/55 |
| 4,027,175 | 5/1977 | Hurst .................................. | 377/114 |

Primary Examiner—John S. Heyman
Assistant Examiner—Karl Ohralik
Attorney, Agent, or Firm—Sughrue, Mion, Zinn, Macpeak, and Seas

[57] ABSTRACT

A high-speed programmable timing generator in which a continuously cycling binary count is compared with an input data word. Predetermined bits, starting from the highest-order end of the counter, can be selectively inhibited to effectively vary the cycle period of the counter. The digital word with which the output of the counter is compared can be varied to set the reference phase of the output timing pulse stream. Further, fine delay adjustment of the phase of the output timing pulse stream is effected by a controllable phase-locked loop.

6 Claims, 4 Drawing Figures

HIGH-SPEED PROGRAMMABLE TIMING GENERATOR

BACKGROUND OF THE INVENTION

The invention relates to a high frequency timing generator which is capable of producing an output timing pulse signal having a selectable frequency and reference phase.

The operation of a digital computer requires a number of sequences of timing pulses which typically bear a fixed relationship to one another. To increase the speed of operation of the computer, the output frequency of the pulse generators used to produce such timing sequences must be correspondingly increased, both to provide higher frequency sequences of timing pulses and also to provide short delay times between different sequences of such pulses. Similarly, systems used to test logic and memory circuits require high-speed operation for purposes of development and manufacturing.

FIG. 1 is a block diagram showing a prior art programmable timing generator of the same general type to which the invention pertains. The output of a clock source 11 is applied to the CLOCK input of a counter 12. The binary count output bits of the counter 12 are applied to corresponding input bits of a first input port of a comparator 13, the second input port of which receives a digital timing pulse interval control word $B = B_N 2^N + \ldots + B_1 2^1 + B_0 2^0$. The comparison output from the comparator 13 is applied to one input of an AND gate 14, the other input of which receives the output from the clock source 11. The output of the AND gate 14 is applied to the RESET input of the counter 12, and also forms the output timing pulse signal on a line 15.

In operation, the digital word inputted to the second input port of the comparator 13 is set to a value which corresponds to the desired output timing pulse interval. When the output of the counter 12 becomes equal to this value, the output of the comparator 13 becomes a logical 1. Thereupon, the AND gate 14 passes a single pulse of the clock signal to the line 15, which also resets the counter 12. The counter 12 then begins its count again from zero, and another timing pulse is generated when the output of the counter 12 again becomes equal to the value of the data word applied to the second input port of the comparator 13.

Chang et al. in IBM Technical Disclosure Bulletin, Vol. 20, No. 3, August 1977, p. 1027, disclose a programmable timing generator capable of operating at frequencies up to about 200 MHz. This sytem has a cycle time which is continuously programmable from five to 2,500 nsec. with the time delay for a particular sequence of pulses being programmable from zero to this cycle time. A reference timing pulse is generated by comparison of the output of a digital frequency counter with a set of reference control bits using an exclusive-OR circuit. The counter is reset by the reference timing pulse, and the counting sequence then restarted. Within the period of the reference timing pulse, a delayed pulse is generated by comparing the frequency counter output with a set of delay control bits, again using an exclusive-OR circuit. Variable delays of less than 20 nanoseconds are produced by gating the delayed pulse with a synchronous fine delay pulse.

In both of the above-described prior art programmable timing generators, the maximum frequency of the output timing pulses is restricted by the necessity of having to reset the counter each time a comparison is reached. That is, the resetting operation of a counter is a relatively slow operation, and limits the maximum frequency at which the generator can be operated.

Parsons et al. in U.S. Pat. No. 4,321,687 disclose a computer-controlled timing system in which the content of a series of shift registers is compared with a plurality of reference control bits (mask sets) stored in the computer. The shift registers contain an initial computer-loaded pattern which is advanced through a series of registers with timing pulses from a clock pulse generator using well-known shift register techniques. After each clock pulse, the bit pattern contained in the shift registers is compared sequentially with each bit of the mask set, and a pulse is generated each time a coincidence is detected between the two patterns. The speed of this system is limited by the requirement that after each clock pulse the content of the shift registers must be transferred to a set of storage registers, a mask fetched from storage, and the sequential comparisons made, all under the control of a computer.

It is an object of the present invention to provide a timing pulse generator which is not limited in frequency like the above-mentioned prior art programmable timing generators. Specifically, it is an object of the invention to provide a programmable timing pulse generator which can operate at frequencies of 500 MHz or higher using currently available components.

SUMMARY OF THE INVENTION

The above, as well as other objects of the invention, are met by programmable timing generator including means for producing a continuously cycling count, means for comparing the count output of the count producing means with an input control digital word, and means for selectively inhibiting predetermined bits of the comparing means such that only bits of the count and the digital word below a predetermined bit position are compared. By "producing a continuously cycling count" is meant producing a count which continuously repeats itself and without resetting at any time during the count. Preferably, the means for producing the continuously cycling count is a synchronous binary counter. The inhibiting means may be a plurality of AND gates, each of which receives a first input from a respective bit of the counter, a second input from a respective bit of an inhibit data word, and an output coupled to a respective bit input of one input port of the comparing means. The other input port of the comparing means is coupled to receive the input control digital word. The clock source may preferably be a clock pulse oscillator and a phase-locked loop having a synchronization input coupled to the output of the clock pulse oscillator, a fine frequency control input coupled to receive a fine control input signal, and an ouput coupled to the clock input of the binary counter. To generate the output timing pulse signal, one input of a further AND gate is coupled through a delay element to the clock pulse source. The other input of this AND gate is coupled to the comparison output terminal of the comparing means.

DESCRIPTION OF THE PREFERRED EMBODIMENTS

Figure 1:
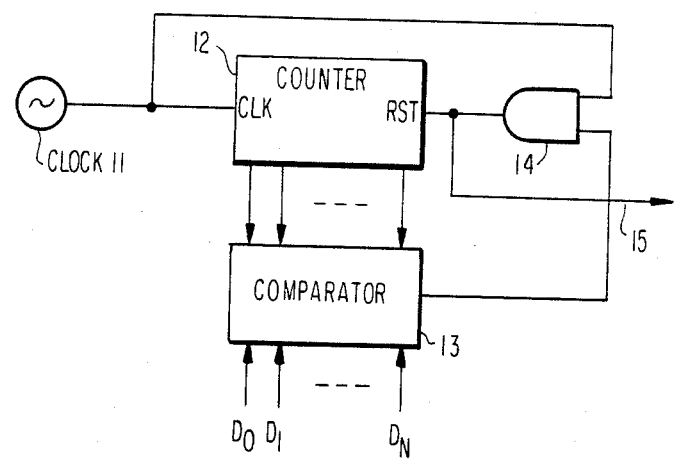
FIG. 1 is a block diagram of a prior art programmable timing generator.
Figure 2:
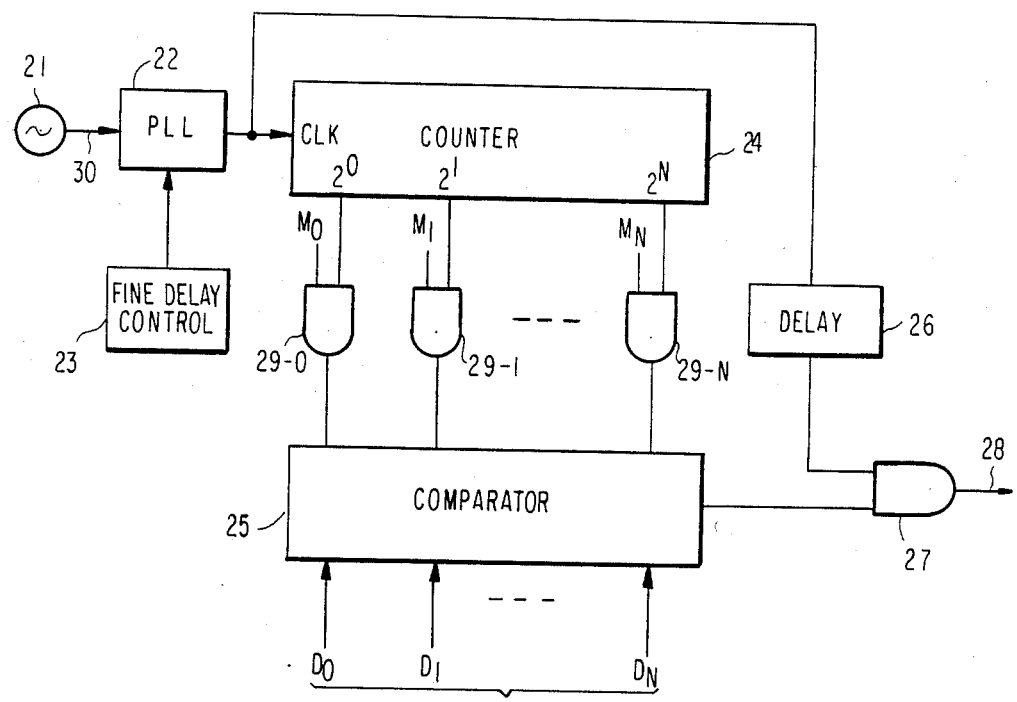
FIG. 2 is a block diagram of a programmable timing generator of the present invention.

Referring now to the block diagram of FIG. 2, a programmable timing generator constructed in accordance with the teachings of the present invention will now be described. The output of a clock source 21 on a line 30 is applied to a synchronization input of a phase-locked loop 22. The clock source 21 may, for instance, be a Model 8660A clock source manufactured by Hewlett-Packard Co., Palo Alto, Calif. The output of a fine delay circuit 23 is fed to a phase control input of the phase-locked loop 22. The detailed construction of the phase-locked loop 22 and the fine delay circuit 23 will be discussed below with reference to FIG. 3.

The output of the phase-locked loop, which, in the example under discussion has a frequency eight times that of the output of the clock source 21, is applied to the clock input of a counter 24. The counter 24 should be a synchronous binary counter. If the frequency of the input clock signal to the counter 24 is too high for readily available "off-the-shelf" counters, it is possible to construct the first one or two bit positions of the counter using high-speed flip-flops with delay elements inserted as needed between the outputs of the flip-flops and the counter output terminals. The count output lines of the counter 24 are fed to first inputs of corresponding AND gates 29-0 through 29-N. The second inputs of the AND gates 29-0 through 29-N receive respective bits $M_0$ through $M_N$ of an inhibit control signal M ($M = M_N 2^N + \ldots + M_1 2^1 + M_0 2^0$), the function of which will be presently described. The outputs of the AND gates are applied to corresponding bit positions of a first input port of a comparator 25. The other input port of the comparator 25 receives respective bits of the digital delay control word D.

The comparison output of the comparator 25, which is in the logical 1 state when the values presented on the two input ports of the comparator 25 are identical, is applied to a first input of AND gate 27, the other input of which receives the same clock signal as the counter 24 but delayed by a delay element 26. The output timing pulse signal is produced on the output line 28 of the AND gate 27.

In operation, the counter 24 produces a continuously cycling count, that is, a count which proceeds from a count of zero to a count of $2^N - 1$ and loops back to zero. The counter 24 need not be reset at any time, although it may be desirable to supply a reset signal to the counter 24 at the time of circuit start-up merely for synchronizing the circuit to the remainder of the system in which the timing generator is employed.

If none of the output bits from the counter 24 are inhibited, that is, if all of $M_0$ through $M_N$ are in the logical 1 state, the output bit lines from the counter 24 are passed directly to the first input port of the comparator 25 and therein compared with corresponding bits of the entire delay control word D. In that case, whatever the value of the word D, the output of the comparator 25 will be in the logical 1 state during one clock period out of $2^N - 1$ clock periods, that is, for one clock period during the counter cycle time. The position of this logical 1 with respect to the time period during which the counter output is zero is determined by the value of D. For instance, if D = 15, the logical 1 at the output of the comparator 25 will occur during the fifteenth clock period. When the output of the comparator 25 is in the logical 1 state, a single clock pulse will be outputted through the AND gate 27 onto the output line 28. The AND gate 27 is then inhibited by the output of the comparator 25 until the next corresponding clock period of the next counter cycle.

In accordance with an important aspect of the invention, the counter cycle period can be made variable by selectively inhibiting output bits of the counter. For instance, if all but output bits $2^0$ and $2^1$ from the counter 24 are inhibited, which may be done by setting $M_0 = M_1 = 1$ and $M_2 = M_3 = \ldots = M_N = 0$, it appears to the comparator 25 that the counter 24 has a cycle time of only four clock periods. In a similar fashion, the counter cycle period can be set to any desired value $2^{kT}$, where k is a positive integer and $T = 1/f_0$, $f_0$ being the frequency of the clock signal produced by the phase-locked loop 22. Preferably, the frequency of the master clock source 21 is variable over a frequency range of 2:1, thus making the output frequency of the phase-locked loop variable over the same range. Needless to say, the bits of the data word D corresponding in bit position to the bits of M which are in the "0" state should also be set to "0". Otherwise, AND gates should be inserted in series with each of the lines which supply $D_0$ through $D_N$ with the outputs of these AND gates applied to the respective bit inputs of the second port of the comparator 25, the first inputs of such AND gates receiving respective bits $D_0$ through $D_N$, and second inputs receiving the signals $M_0$ through $M_N$, respectively.

Figure 4:
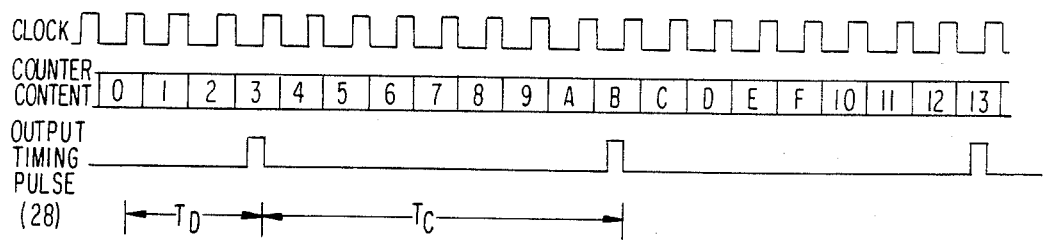
FIG. 4 is a timing diagram used to explain the operation of the timing generator of FIG. 2.

Referring now to the diagram of FIG. 4, a specific example of the operation of the programmable timing generator of the invention will be discussed. The clock input to the counter 24 is shown at the top of the figure and the actual (uninhibited) count output of the counter is indicated in the center of hexadecimal notation. In this example, it is assumed that $D_0 = D_1 = 1$, $D_2 = D_3 = \ldots = D_N = 0$, $M_0 = M_1 = M_2 = 1$, and $M_3 = M_4 = \ldots = M_N = 0$. In this case, the output of the comparator 25 goes to the logical 1 state whenever the output bits $2^0$, $2^1$ and $2^2$ of the counter 24 are in states of 1, 1 and 0, respectively. This occurs for counter outputs, in hexadecimal notation, of 3 ( ... 00011), B ( ... 01011), 13 ( ... 10011), etc.

As should be clear from this discussion, the time $T_D$ from the time that the counter output is in the zero state until the first pulse of the output timing pulse sequence is generated is $T_D = D \times T$, and the time $T_C$ between output timing pulses, that is, the period of the output timing pulses, is $T_C = (2^j)T$, where j is the number of lower order bits of M in the logical 1 state. Since T is a variable over a period of 2:1 any value of $T_c$ is attainable (within the limits of the system).

Figure 3:
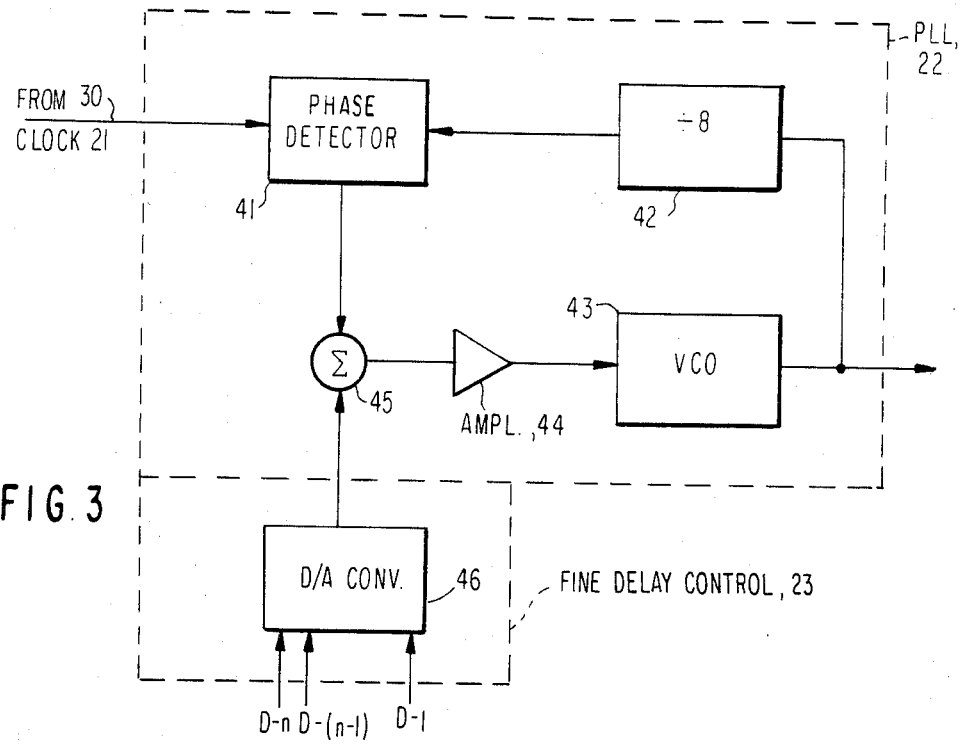
FIG. 3 is a more detailed diagram of a phase-locked loop and associated fine delay circuit of the timing generator of FIG. 2.

Referring now to FIG. 3, a preferred arrangement of the phase-locked loop 22 and the fine delay control circuit 23 will be described. The output signal on line 30 from the clock source 21 is applied to one input of a phase detector 41, the other input of which is received from the output of a frequency divider 42. As mentioned above, in the example of a timing generator herein described, the output frequency of the phase-locked loop 22 should be eight times that of the clock source 21. To this effect, the frequency divider 42 should be a divide-by-eight frequency divider. The output of the phase detector 41 is applied to one input of an analog signal summer circuit 45, the output of which is amplified by an amplifier 44 and applied to the frequency control input of the voltage-controlled oscillator 43. The output of the voltage-controlled oscillator 43 feeds the input of the frequency divider 42, and also forms the output of the phase-locked loop circuit 22 which is applied to the clock input of the counter 24. The fine delay control circuit 23 is preferably implemented as a digital-to-analog converter 46. Digital input bits $D_{-1}$ through $D_{-n}$ to the digital-to-analog converter 46 can then be manipulated to produce a desired output analog voltage from the digital-to-analog converter 46. Hence, due to the summing of the output of the digital-to-analog converter 46 with the output of the phase detector 41 by the analog signal summer circuit 45, the output phase from the phase-locked loop 22 can be finely adjusted. By properly scaling the output of the digital-to-analog converter 46, the bits $D_{-n}$ through $D_{-1}$ can be used as the fractional part of the data word D so that the range of fine delay control $T_F$ is within the time period T. Therefore, the total delay $T_T$ is: $T_T = T_F + T_D$.

This completes the description of the preferred embodiments of the invention. Although preferred embodiments have been described, it is believed that numerous modifications and alterations thereto would be apparent to one of ordinary skill in the art without departing from the spirit and scope of the invention.

We claim:

1. A programmable timing generator comprising;
   means for producing a continuously cycling count;
   means for comparing said count with a phase control digital word; and
   means for selectively inhibiting a predetermined and variable number of the higher ordered bits of said comparing means such that only those bits of said count and said digital word below a predetermined bit position corresponding to said number are compared.

2. The programmable timing generator of claim 2, wherein said means for producing said continuously cycling count comprises a clock source and a synchronous binary counter.

3. The programmable timing generator of claim 2, wherein said inhibiting means comprises a plurality of AND gates, each of said AND gates having a first input coupled to a respective output bit of said counter, a second input receiving a respective bit of an inhibit data word, and an output coupled to a respective input bit of one input port of said comparing means, the other input port of said comparing means being coupled to receive said phase control digital word.

4. The programmable timing generator of claim 2, wherein said clock source comprises a clock pulse oscillator, and a phase-locked loop having a synchronization input coupled to an output of said clock pulse oscillator, a phase control input coupled to receive a source of a fine delay control input signal, and an output coupled to a clock input of said binary counter.

5. The programmable timing generator of claim 4, wherein said source of a fine delay control input signal comprises an analog-to-digital converter.

6. The programmable timing generator of claim 2, further comprising an AND gate and a delay element, said delay element being coupled between an output of said clock source and a first input of said AND gate, and a second input of said AND gate being coupled to a comparison output terminal of said comparing means, an output timing pulse signal being produced on an output of said AND gate.

* * * * *